US012750996B2

(12) United States Patent
Karda et al.

(10) Patent No.: US 12,750,996 B2
(45) Date of Patent: Sep. 29, 2026

(54) MEMORY CIRCUITRY AND METHODS USED IN FORMING MEMORY CIRCUITRY

(71) Applicant: Micron Technology, Inc., Boise, ID (US)

(72) Inventors: Kamal M. Karda, Boise, ID (US); David Daycock, Boise, ID (US); Albert Liao, Boise, ID (US); Si-Woo Lee, Boise, ID (US); Haitao Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 369 days.

(21) Appl. No.: 18/598,585

(22) Filed: Mar. 7, 2024

(65) Prior Publication Data

US 2024/0315001 A1 Sep. 19, 2024

Related U.S. Application Data

(60) Provisional application No. 63/452,900, filed on Mar. 17, 2023.

(51) Int. Cl.
*H10B 12/00* (2023.01)

(52) U.S. Cl.
CPC ............. *H10B 12/30* (2023.02); *H10B 12/05* (2023.02)

(58) Field of Classification Search
CPC ......... H10B 12/30; H10B 12/05; H10B 12/03
See application file for complete search history.

(56) References Cited

U.S. PATENT DOCUMENTS

2018/0323199 A1 11/2018 Roberts et al.
2018/0323200 A1 11/2018 Tang et al.
(Continued)

FOREIGN PATENT DOCUMENTS

WO WO PCT/US2020/018895 7/2024
WO WO PCT/US2024/018895 7/2024

*Primary Examiner* — Ratisha Mehta
(74) *Attorney, Agent, or Firm* — Wells St. John P.S.

(57) ABSTRACT

Memory circuitry comprises vertically-alternating tiers of insulative material and memory cells. The memory cells individually comprising a transistor comprise a first source/drain region, a second source/drain region, and a channel region between the first and second source/drain regions. A gate is operatively-proximate the channel region. A capacitor comprises a first capacitor electrode, a second capacitor electrode, and a capacitor insulator between the first and second capacitor electrodes. The first capacitor electrode is directly electrically coupled to the first source/drain region. The second capacitor electrode of multiple of the capacitors is directly electrically coupled with one another. Digitlines extend elevationally through the vertically-alternating tiers. Individual of the second source/drain regions of individual of the transistors that are in different memory-cell tiers are directly electrically coupled to individual of the digitlines. A wordline is in individual of the memory-cell tiers that comprises the gate of multiple of the individual transistors in the individual memory-cell tiers. The wordline in a lower of the memory-cell tiers has a greater minimum width than a minimum width of the wordline in a higher of the memory-cell tiers that is directly above the lower memory-cell tier. Methods are also disclosed.

20 Claims, 9 Drawing Sheets

(56) References Cited

U.S. PATENT DOCUMENTS

| | | | | |
|---|---|---|---|---|
| 2019/0103406 | A1 | 4/2019 | Tang et al. | |
| 2020/0176465 | A1 | 6/2020 | Tang et al. | |
| 2021/0125989 | A1 | 4/2021 | Shin et al. | |
| 2021/0210498 | A1 * | 7/2021 | Leobandung | G11C 16/24 |
| 2022/0199627 | A1 | 6/2022 | Fishburn et al. | |
| 2022/0271040 | A1 | 8/2022 | Kim | |
| 2022/0335982 | A1 * | 10/2022 | He | H10D 62/118 |
| 2022/0367520 | A1 | 11/2022 | Hong et al. | |

* cited by examiner

MEMORY CIRCUITRY AND METHODS USED IN FORMING MEMORY CIRCUITRY

TECHNICAL FIELD

Embodiments disclosed herein pertain to memory circuitry and to methods used in forming memory circuitry.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The digitlines may conductively interconnect memory cells along columns of the array, and the access lines may conductively interconnect memory cells along rows of the array. Each memory cell may be uniquely addressed through the combination of a digitline and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A capacitor is one type of electronic component that may be used in a memory cell. A capacitor has two electrical conductors separated by electrically insulating material. Energy as an electric field may be electrostatically stored within such material. Depending on composition of the insulator material, that stored field will be volatile or non-volatile. For example, a capacitor insulator material including only $SiO_2$ will be volatile. One type of non-volatile capacitor is a ferroelectric capacitor which has ferroelectric material as at least part of the insulating material. Ferroelectric materials are characterized by having two stable polarized states and thereby can comprise programmable material of a capacitor and/or memory cell. The polarization state of the ferroelectric material can be changed by application of suitable programming voltages and remains after removal of the programming voltage (at least for a time). Each polarization state has a different charge-stored capacitance from the other, and which ideally can be used to write (i.e., store) and read a memory state without reversing the polarization state until such is desired to be reversed. Less desirable, in some memory having ferroelectric capacitors the act of reading the memory state can reverse the polarization. Accordingly, upon determining the polarization state, a re-write of the memory cell is conducted to put the memory cell into the pre-read state immediately after its determination. Regardless, a memory cell incorporating a ferroelectric capacitor ideally is non-volatile due to the bi-stable characteristics of the ferroelectric material that forms a part of the capacitor. Other programmable materials may be used as a capacitor insulator to render capacitors non-volatile.

A field effect transistor is another type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate. Regardless, the gate insulator may be programmable, for example being ferroelectric.

DETAILED DESCRIPTION OF EXAMPLE EMBODIMENTS

Embodiments of the invention encompass memory circuitry, such as DRAM, and methods used in forming memory circuitry, such as a DRAM. Example method embodiments are described with reference to FIGS. 1-15.

Figure 1:
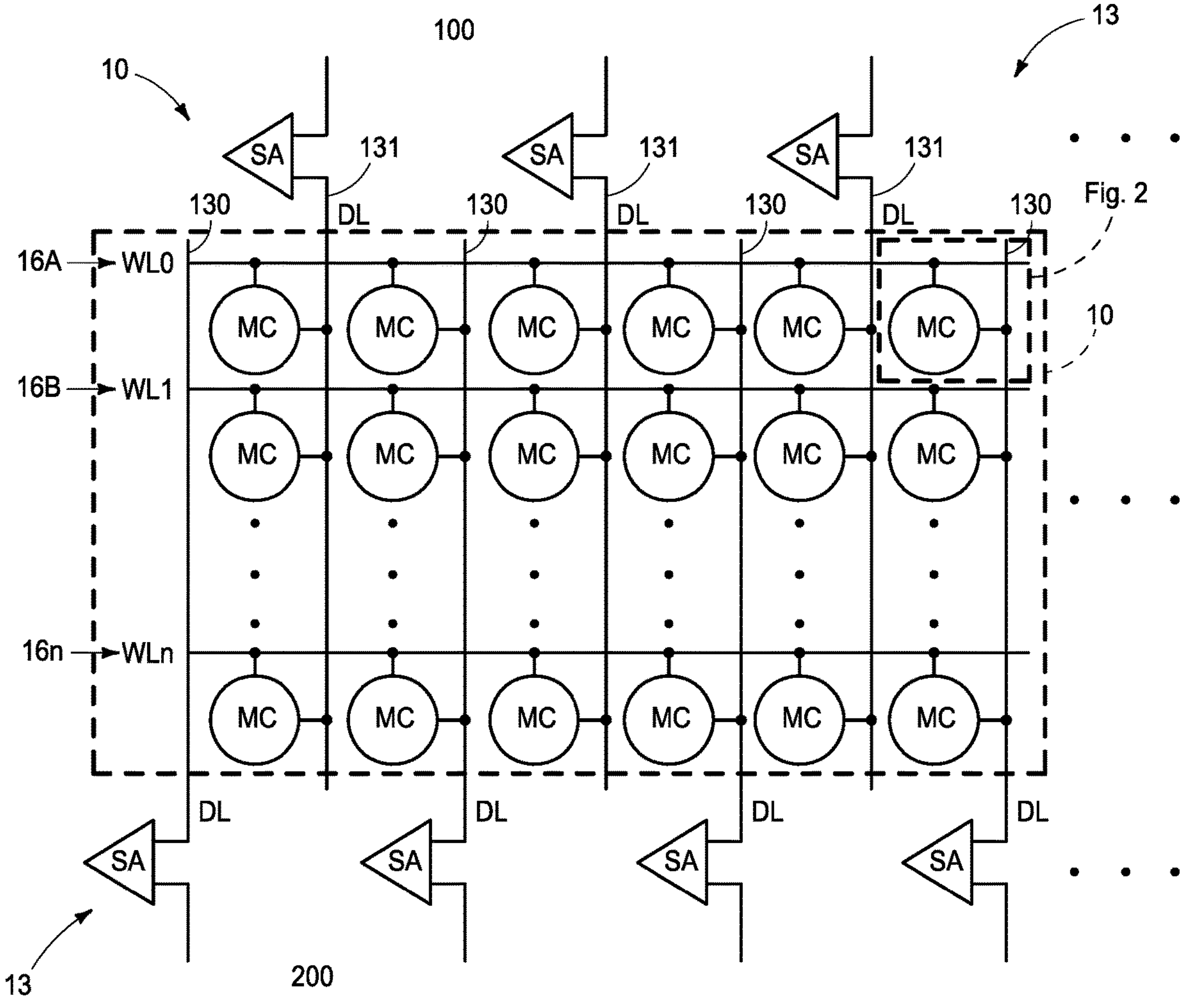
FIG. 1 is a diagrammatic schematic of a DRAM memory array and peripheral circuitry in accordance with the prior art and in accordance with an embodiment of the invention.
Figure 2:
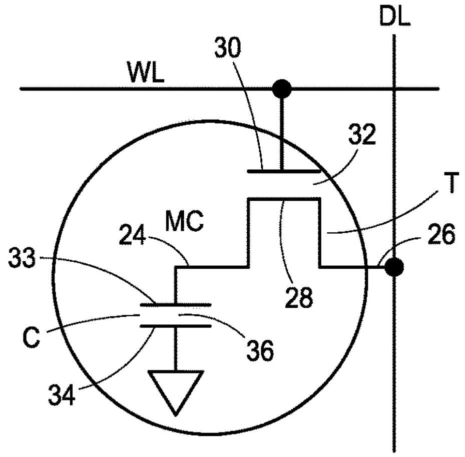
FIG. 2 is an enlargement of a portion of FIG. 1.

One example prior art schematic diagram of DRAM circuitry, and in accordance with an embodiment of the invention, is shown in FIGS. 1 and 2. FIG. 2 shows example memory cells MC individually comprising a transistor T and a capacitor C. One electrode of capacitor C is directly electrically coupled to a suitable potential (e.g., ground) and the other capacitor electrode is contacted with or comprises one of the source/drain regions of transistor T. The other source/drain region of transistor T is directly electrically coupled with a digitline 130 or 131 (also individually designated as DL). The gate of transistor T is directly electrically coupled with (e.g., comprises part of) a wordline WL. FIG. 1 shows digitlines 130 and 131 extending from one of opposite sides 100 and 200 of a memory array area 10 into a peripheral circuitry area 13 that is aside memory array area 10. Digitlines 130 and 131 individually directly electrically couple with a sense amp SA on opposite sides 100 and 200 of array area 10 within peripheral circuitry area 13.

Figure 3:
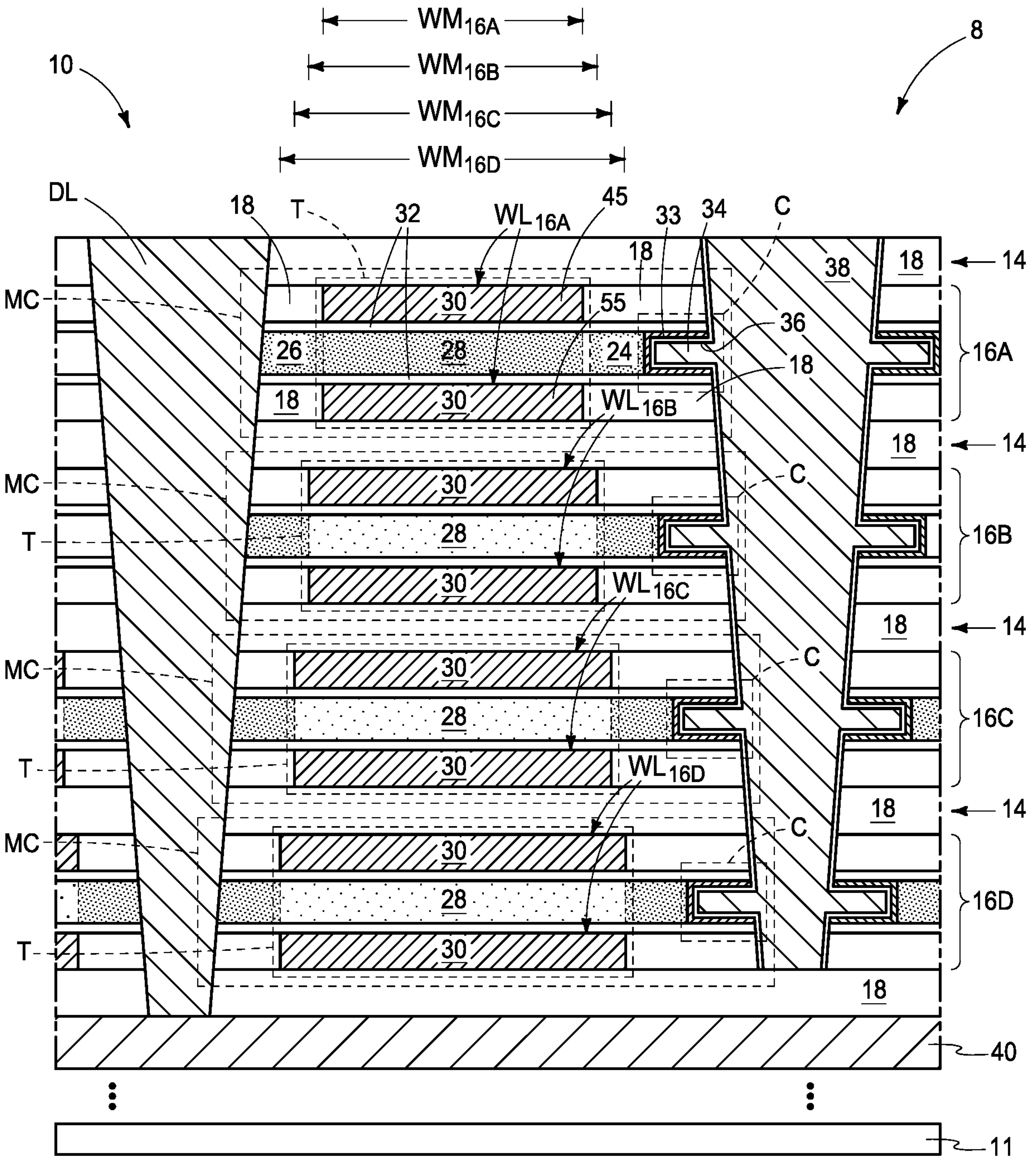
FIGS. 3 and 4 are diagrammatic sectional views, taken together with FIGS. 1 and 2, of constructions in accordance with embodiments of the invention.

Referring to FIG. 1-3, an example fragment of a substrate construction 8 comprising array or array area 10 has been fabricated relative to a base substrate 11. Substrate 11 may comprise any one or more of conductive/conductor/conducting, semiconductive/semiconductor/semiconducting, and insulative/insulator/insulating (i.e., electrically herein) materials. Materials may be aside, elevationally inward, or elevationally outward of the FIG. 3-depicted materials. For example, other partially or wholly fabricated components of integrated circuitry may be provided somewhere above, about, or within base substrate 11. Control and/or other peripheral circuitry for operating components within a memory array may also be fabricated and may or may not be wholly or partially within a memory array or sub-array. Further, multiple sub-arrays may also be fabricated and operated independently, in tandem, or otherwise relative one another. As used in this document, a "sub-array" may also be considered as an array.

Memory circuitry (e.g., that of or comprising construction 8) comprises vertically-alternating tiers 14, 16* of insulative material 18 (e.g., silicon dioxide and/or silicon nitride) and memory cells MC (an * being used as a suffix to be inclusive of all such same-numerically-designated structures or portions thereof that may or may not have other suffixes). Only four memory-cell tiers 16* and five insulative-material tiers 14 are shown for clarity and brevity, although likely many more of such would be in construction 8 (not shown). Memory-cell tiers 16* have independently been designated as one of 16A, 16B, 16C, and 16D moving progressively deeper in the stack of materials shown in FIG. 3.

Memory cells MC individually comprise a transistor T comprising a first source/drain region 24, a second source/drain region 26, and a channel region 28 between the first and second source/drain regions. Regions 24, 26, and 28 of different immediately-horizontally-adjacent memory cells MC into and out of the plane of the page upon which FIG. 3 lies in a common memory-cell tier 16* may be isolated relative one another by insulative material (not shown). A gate 30 is operatively-proximate channel region 28 (e.g., there being a gate insulator 32 between gate 30 and channel region 28).

Memory cells MC also individually comprise a capacitor C comprising a first capacitor electrode 33, a second capacitor electrode 34, and a capacitor insulator 36 between the first and second capacitor electrodes. First capacitor electrodes 33 of different immediately-horizontally-adjacent memory cells MC into and out of the plane of the page upon which FIG. 3 lies in a common memory-cell tier 16* may be isolated relative one another by insulative material (not shown). First capacitor electrode 33 is directly electrically coupled to first source/drain region 24. Second capacitor electrode 34 of multiple capacitors are directly electrically coupled with one another (e.g., through a vertical interconnect 38 that would directly electrically couple with other such vertical interconnects [not shown]). First capacitor electrode 33 of capacitor C is shown as being single-sided with respect to second capacitor electrode 34, although of course the second capacitor electrode could be on both sides of the first capacitor electrode (e.g., be double-sided).

Digitlines DL extend elevationally through (e.g., vertically) vertically-alternating tiers 14 and 16*. Digitlines DL of different immediately-horizontally-adjacent memory cells MC into and out of the plane of the page upon which FIG. 3 lies in a common memory-cell tier 16* may be isolated relative one another by insulative material (not shown). Individual second source/drain regions 26 of individual transistors T that are in different memory-cell tiers 16* are directly electrically coupled to individual digitlines DL.

A wordline WL* is in individual memory-cell tiers 16* and comprises the gate 30 of multiple of individual transistors T in individual memory-cell tiers 16*. With respect to the construction exemplified by FIG. 3, wordlines WL* may extend perpendicularly into and out of the plane of the page upon which FIG. 3 lies, be horizontally-parallel one another, and be horizontally continuous among a plurality of transistors T in individual memory-cell tiers 16* along a row direction. Analogously, and also by way of example, digitlines DL may directly electrically couple with a horizontal interconnect 40, with interconnects 40 comprising lines that run parallel with the plane of the page upon which FIG. 3 lies, are spaced relative to one another perpendicularly into and out of the plane of the page upon which FIG. 3 lies, and are horizontally-parallel one another among a plurality of memory cells MC in individual memory-cell tiers 16* along a column direction. Interconnects 40 may alternately be atop the depicted stack (not shown) instead of at the bottom thereof. Regardless, wordline WL* in a lower of memory-cell tiers 16* has a greater minimum width WM* than a minimum width WM* of the wordline WL* in a higher of memory-cell tiers 16* that is directly above the lower memory-cell tier 16*. Example wordlines WL* in the depicted FIG. 3 cross-section are shown as having vertical sidewalls and thereby constant width therein (i.e., the minimum and maximum widths thereof are the same in the cross-section), although such is not required. Herein, "width" by itself (no preceding adjective) is defined as the mean straight-line distance through a given material or region in a width direction. Additionally, the various materials or regions described herein may be of substantially constant width or of variable width. If of variable width, width (no preceding adjective) refers to average width unless otherwise indicated, and such material or region will have some minimum (least) width and some maximum (most) width due to the width being variable.

In one embodiment and as shown, wordline WL* in individual memory-cell tiers 16* comprises an upper wordline 45 directly above channel region 28 and a low wordline 55 directly below channel region 28 where, for example, channel regions 28 are individually top-and-bottom gated. Alternately, and by way of example, channel regions 28 may individually be only one of top-gated or bottom-gated (not shown). In one embodiment where comprising upper wordline 45 and low wordline 55, low wordline 55 in at least some of individual memory-cell tiers 16* has minimum width WM* that is the same as minimum width of its upper wordline 45 (e.g., in each individual memory-cell tier 16* as shown).

In one embodiment and as shown, minimum width WM* of each of wordlines WL* in individual memory-cell tiers 16* is greater than minimum width WM* of the wordline WL* in the individual memory-cell tier 16* that is immediately-directly-there-above (regardless of WL* being only a single wordline in individual memory-cell tiers 16* or whether being upper and low wordlines and, if the latter, regardless of whether such have the same or different minimum width[s]).

Any other attribute(s) or aspect(s) as shown and/or described herein with respect to other embodiments may be used in the embodiments shown and described with reference to the above embodiments.

Figure 4:
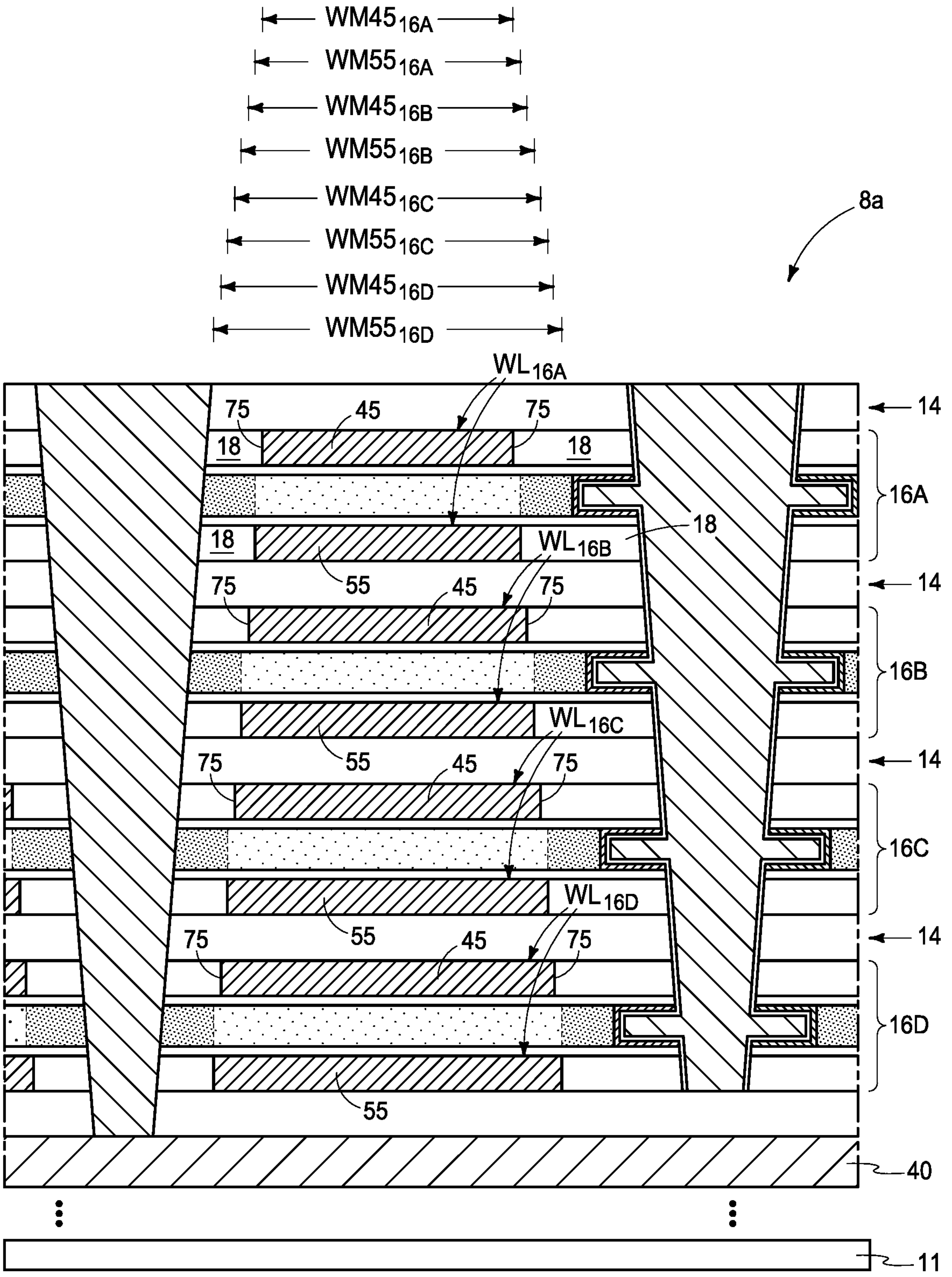

FIG. 4 shows an alternate embodiment construction 8*a*. Like numerals from the above-described embodiments have been used where appropriate, with some construction differences being indicated with the suffix "a" (small letter "a") or with different numerals. In construction 8*a*, the low wordline 55 in at least some of the individual memory-cell tiers 16* (in each as shown) has greater minimum width WM* than minimum width of its upper wordline 45. In one such embodiment and as shown, the greater minimum width WM* of low wordline 55 and the minimum width WM* of upper wordline 45 are in a same vertical cross-section (e.g., that of FIG. 4). Low wordline 55 in said at least some of individual memory-cell tiers 16* (each as shown) extends laterally-outward beyond both sides 75 of its upper wordline 45 in the same vertical cross-section. Any other attribute(s) or aspect(s) as shown and/or described herein with respect to other embodiments may be used.

Embodiments of the invention encompass methods used in forming memory circuitry, by way of example only that incorporates device/structure as referred to above. Nevertheless, the method embodiments may incorporate, form, and/or have any of the attributes described with respect to device embodiments.

FIGS. 5-9 by way of example sequentially show predecessor structures in example methods used in forming memory circuitry, with such circuitry comprising memory cells that individually comprise a transistor. Such processing may be considered by some as being analogous to "replacement-gate" or "gate-last" processing used in the fabrication of NAND circuitry.

Figure 5:
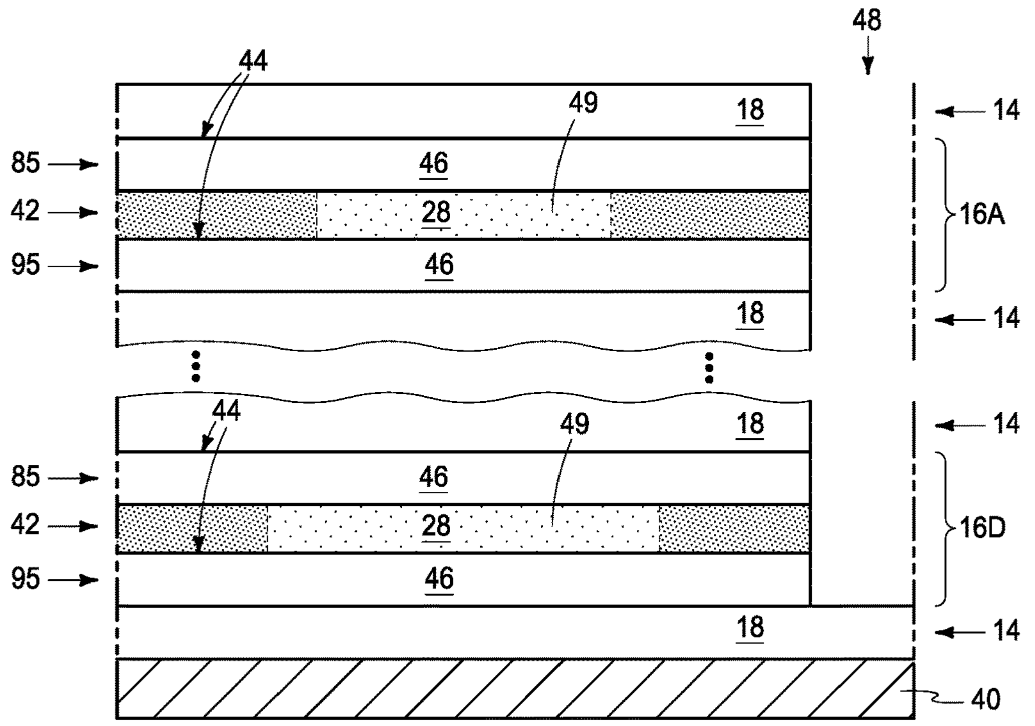
FIGS. 5-15 are diagrammatic sequential sectional, expanded, enlarged, perspective, and/or partial views of constructions in process in accordance with some embodiments of the invention.

Referring to FIG. 5, vertically-alternating insulative-material tiers 14 and memory-cell tiers 16* have been formed. Only two memory-cell tiers 16A and 16D from FIG. 3 are shown for brevity. Memory-cell tiers 16* comprise a channel-material tier 42 comprising channel material 49 that will comprise channel region 28 and a wordline tier 44 comprising sacrificial material 46. In one embodiment and as shown, wordline tier 44 in individual memory-cell tiers 16* comprises an upper wordline tier 85 directly above channel material 49 and a low wordline tier 95 directly below channel material 49. An opening 48 has been formed elevationally through vertically-alternating insulative-material tiers 14 and memory-cell tiers 16*. Opening 48 may comprise an opening in which a digitline DL will be formed, an opening in which an interconnect 38 will be formed, or some other opening.

Figure 6:
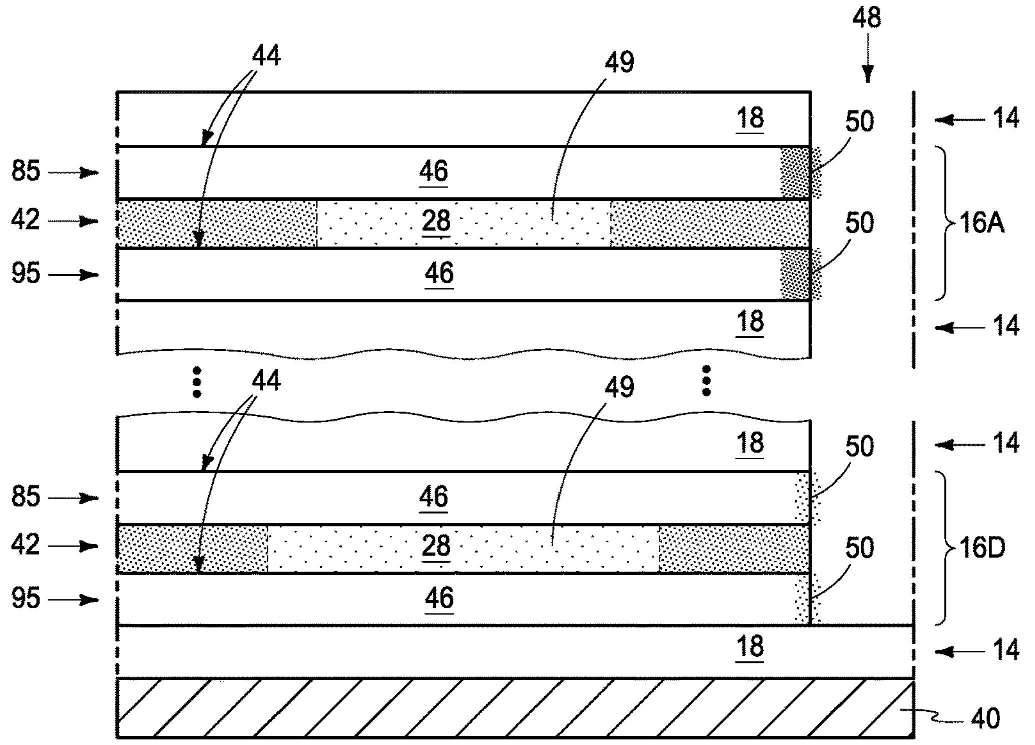

Referring to FIG. 6, an etch inhibitor has been flowed into opening 48 and laterally against sidewalls 50 of sacrificial material 46 of wordline tiers 44. The etch inhibitor may be characterized by its composition being resistant to an etching step referred to below. A greater quantity of the etch inhibitor is deposited against sidewalls 50 of sacrificial material 46 in a higher of wordline tiers 44 than is deposited against sidewalls 50 of sacrificial material 46 in a lower of wordline tiers 44 that is directly below the higher wordline tier 44. The etch inhibitor may any one or more of adsorb to, absorb to, or penetrate through sidewalls 50. Density of stippling is used to diagrammatically indicate quantity of the etch inhibitor, with more-dense stippling indicating more of the etch inhibitor as compared to less-dense stippling. The etch inhibitor may also be deposited in opening 48 against sidewalls of tiers 14 and 42 (not shown). More of the etch inhibitor may adhere in higher wordline tiers 44 as compared to lower wordline tiers 44 due to the etch inhibitor more easily/readily penetrating laterally into the higher wordline tiers due to lateral-inward taper of opening 48 moving deeper into the stack (if present and not shown in FIGS. 5-9) and/or greater difficulty in getting the etch inhibitor to penetrate vertically deeper in opening 48 as compared to vertically shallower in opening 48. The artisan is capable of selecting suitable etch inhibitors depending on composition of sacrificial material 46 and the etching chemistry to be used. For example, and by way of example only, sacrificial material 46 may at least predominantly comprise (i.e., more than 50% up to and including 100%) a silicon nitride. Example etch inhibitors for such a sacrificial material include at least one of carbon and $H_2$ where at least one of hydrogen fluoride and phosphoric acid are used in a subsequent etch of such sacrificial material. Example conditions for depositing an etch inhibitor include any suitable precursor(s), temperature of 100° C. to 1,200° C., pressure of 1 mTorr to 760 Torr, and time of depositing 1 second to 30 minutes (with or without plasma).

Figure 7:
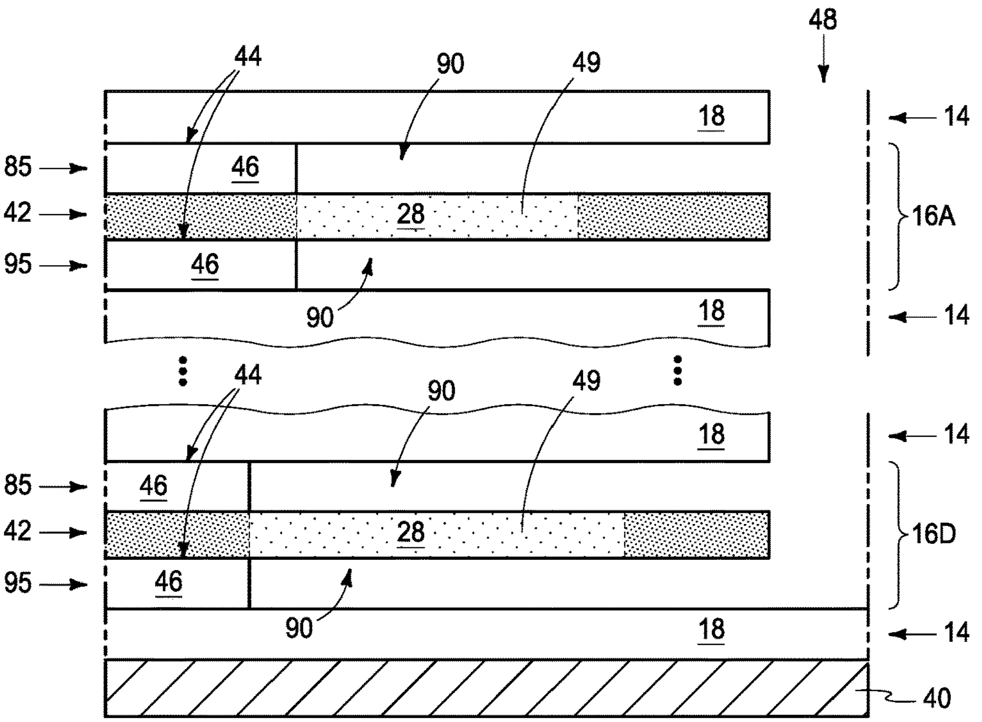
Figure 8:
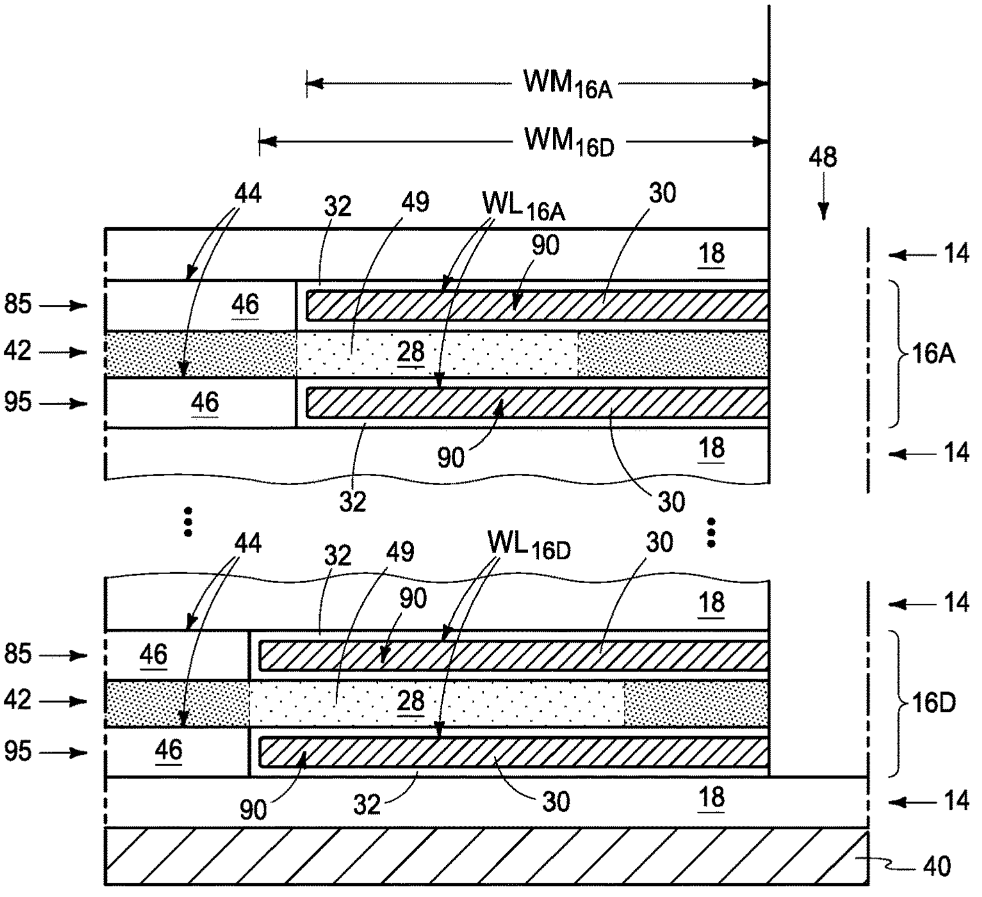

Referring to FIG. 7, some of sacrificial material 46 has been etched from wordline tiers 44 through opening 48 selectively relative to channel material 49 of the channel-material tiers 42 and selectively relative to insulative material 18 of insulative-material tiers 14 (e.g., forming a void-space 90). The greater quantity of the etch inhibitor that was deposited against sacrificial-material sidewalls 50 in the higher wordline tier 44 is used to etch less of sacrificial material 46 from the higher wordline tier 44 than from the lower wordline tier 44 during the etching (e.g., the etch-inhibitor [not shown] ultimately being removed by the etching) (e.g., void-space 90 the lower wordline tier 44 being wider than the void-space in the higher wordline tier 44). In one embodiment where there is an upper wordline tier 85 and a low wordline tier 95, and as shown, the some of sacrificial material 46 that is etched is from each of upper wordline tier 85 and low wordline tier 95.

After the etching and through opening 48, conductive material is formed in the wordline tiers (e.g., in void-space 90) to form a wordline in individual of the wordline tiers that comprises a gate of multiple of individual of the transistors in individual of the memory-cell tiers. The wordline in the lower wordline tier has a greater minimum width WM* than a minimum width WM* of the wordline in the higher wordline tier. As an example, and referring to FIG. 8, gate insulator 32 has been formed in wordline tiers 44. Thereafter, and through opening 48, conductive material 52 has been formed in wordline tiers 44 and thereafter has been removed from opening 48, thus forming a wordline WL* in individual wordline tiers 44 that comprises a gate 30 of multiple of individual transistors T in individual memory-cell tiers 16*. In one embodiment where there is an upper wordline tier 85 and a low wordline tier 95, and as shown, conductive material 52 has been formed in each of the upper wordline tier 85 and low wordline tier 95 and an upper wordline 45 has been formed that is directly above channel material 49 and a low wordline 55 has been formed that is directly below channel material 49.

Figure 9:
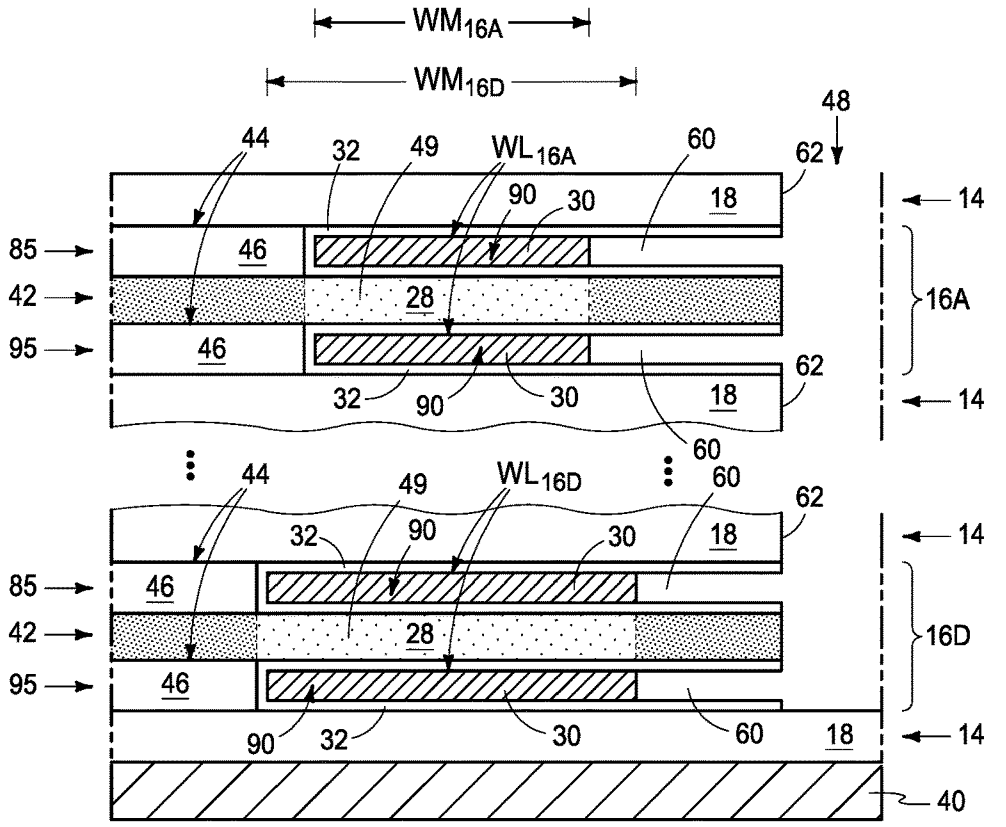

Referring to FIG. 9, and in one embodiment, some of conductive material 52 has been etched selectively relative to insulative material 18 of insulative-material tiers 14 to form a lateral recess 60 in wordline tiers 44 relative to sidewalls 62 in opening 48 of insulative material 18 in insulative-material tiers 14. Regardless, and in one embodiment, the memory cells that are ultimately formed are formed to individually comprise a capacitor (e.g., as shown in FIGS. 3 and 4). Subsequent to the example processing shown by FIG. 9, processing may be conducted to produce constructions analogous to that shown in FIGS. 3 and 4. Remaining sacrificial material 46 as shown in FIG. 9 may be removed or remain in the finished-circuitry construction if insulative. Any other attribute(s) or aspect(s) as shown and/or described herein with respect to other embodiments may be used FIGS. 10-15 are used to describe other example methods used in forming memory circuitry, with such circuitry comprising memory cells that individually comprise a transistor.

Figure 10:
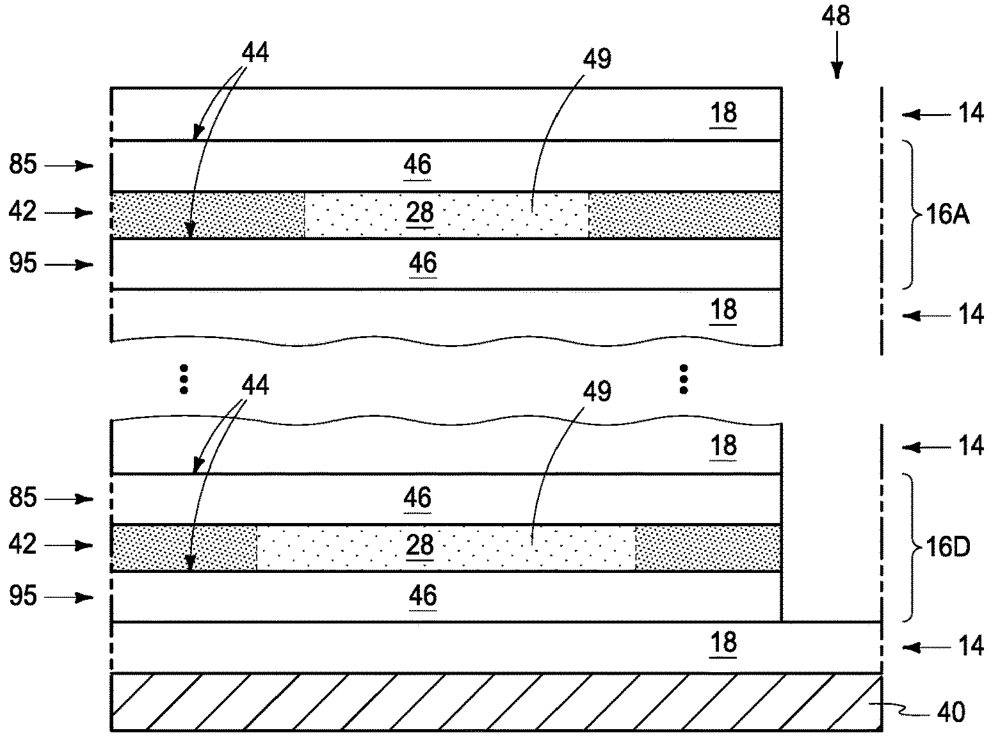

Referring to FIG. 10, vertically-alternating insulative-material tiers 14 and memory-cell tiers 16* have been formed. Only two memory-cell tiers 16A and 16D from FIG. 3 are shown for brevity. Memory-cell tiers 16* comprise a channel-material tier 42 comprising channel material 49 that will comprise channel region 28 and a wordline tier 44 comprising first sacrificial material 46. In one embodiment and as shown, wordline tier 44 in individual memory-cell tiers 16* comprises an upper wordline tier 85 directly above channel material 49 and a low wordline tier 95 directly below channel material 49. An opening 48 has been formed elevationally through vertically-alternating insulative-material tiers 14 and memory-cell tiers 16*. Opening 48 may comprise an opening in which digitlines DL will be formed, an opening in which interconnect 38 will be formed, or some other opening.

Figure 11:
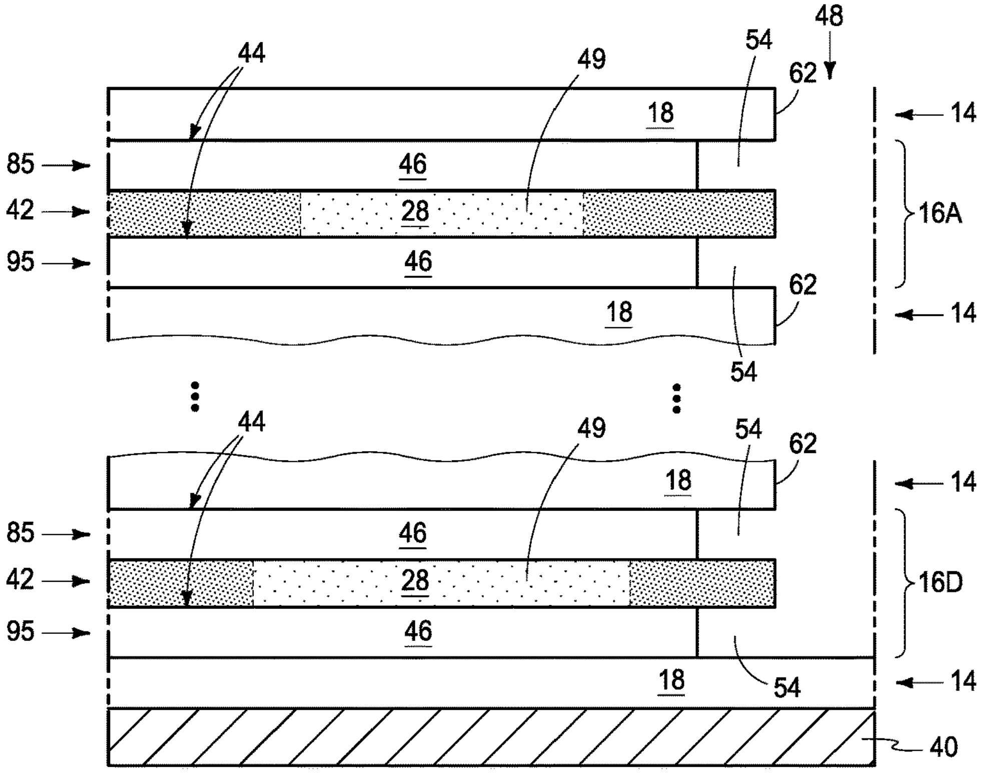

Referring to FIG. 11, some of first sacrificial material 46 has been first etched in wordline tiers 44 through opening 48 selectively relative to insulative material 18 of insulative-material tiers 14 (e.g., using phosphoric acid where material in channel-material tier 42 comprises silicon and the insulative material comprises silicon dioxide). The first etching forms a lateral recess 54 in wordline tiers 44 relative to sidewalls 62 in opening 48 of insulative material 18 of insulative-material tiers 14.

Figure 12:
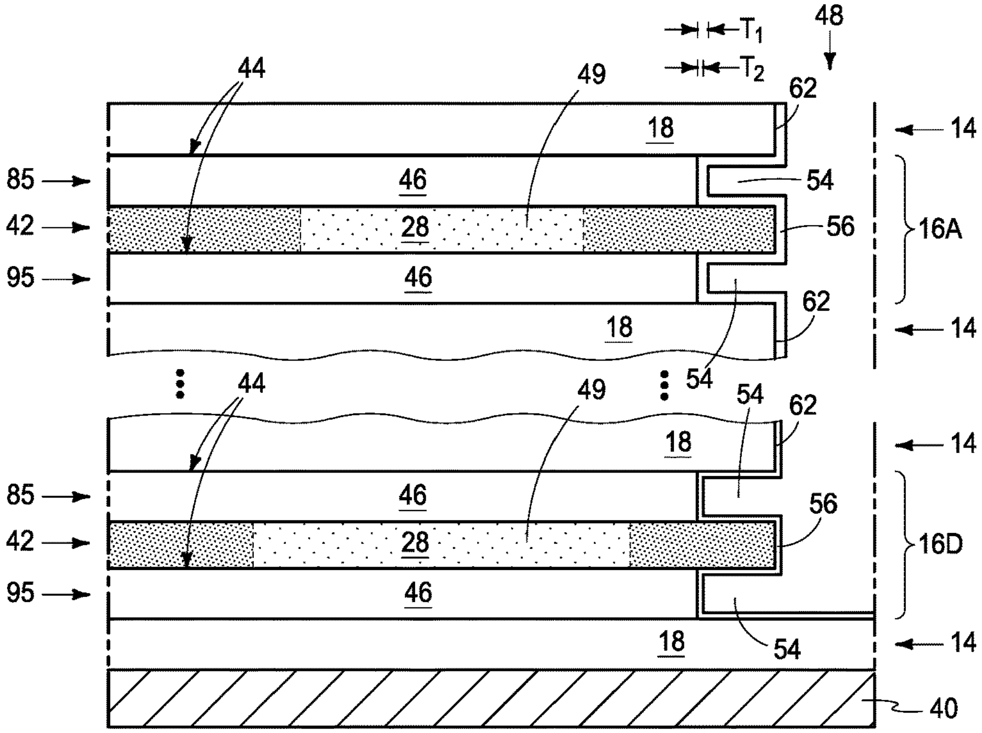

Referring to FIG. 12, second sacrificial material 56 has been formed in and to less-than-fill lateral recesses 54. Second sacrificial material 56 is of different composition from that of channel material 49 of channel-material tiers 42 and from that of insulative material 18 of insulative-material tiers 14. In one embodiment, second sacrificial material 56 is of different composition from that of first sacrificial material 46. Example second sacrificial materials, and by way of example only, comprise at least one of an aluminum oxide, a hafnium oxide, and a zirconium oxide, and an example first sacrificial material at least predominately comprises a silicon nitride. Regardless, second sacrificial material 56 is laterally thicker ($T_1$) in a higher of wordline tiers 44 than in a lower of wordline tiers 44 that is directly below the higher wordline tier ($T_2$). By way of example, such different lateral thicknesses in at least some different-elevation memory-cell tiers 16* inherently results in CVD from less of the deposition precursors/depositing material inherently penetrating deeper into the stack than shallower into the stack (as well as laterally into recesses 54). Further, such different lateral thickness in different-elevation memory-cell tiers 16* can desirably increase due to inward taper of opening 48 moving deeper into the stack of materials.

Figure 13:
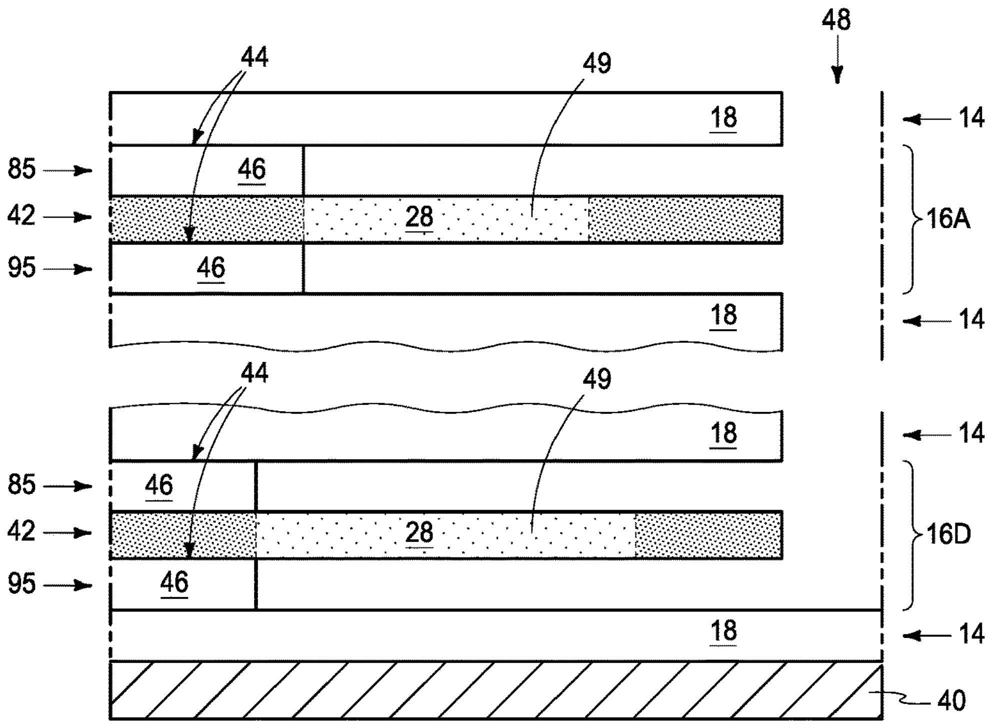

Referring to FIG. 13, another some of first sacrificial material 46 has been second etched from wordline tiers 44 (85 and 95 if present) through opening 48 selectively relative to insulative material 18 of insulative-material tiers 14. Such second etching has also etched through second sacrificial material 56 (such thereby not being shown) in individual wordline tiers 44 before etching the another some sacrificial material 56 in individual wordline tiers 44. The laterally-thicker second sacrificial material 56 in individual wordline tiers 44 has been used to etch less of first sacrificial material 46 from the higher wordline tier 44 than from the lower wordline tier 44 during such second etching.

Figure 14:
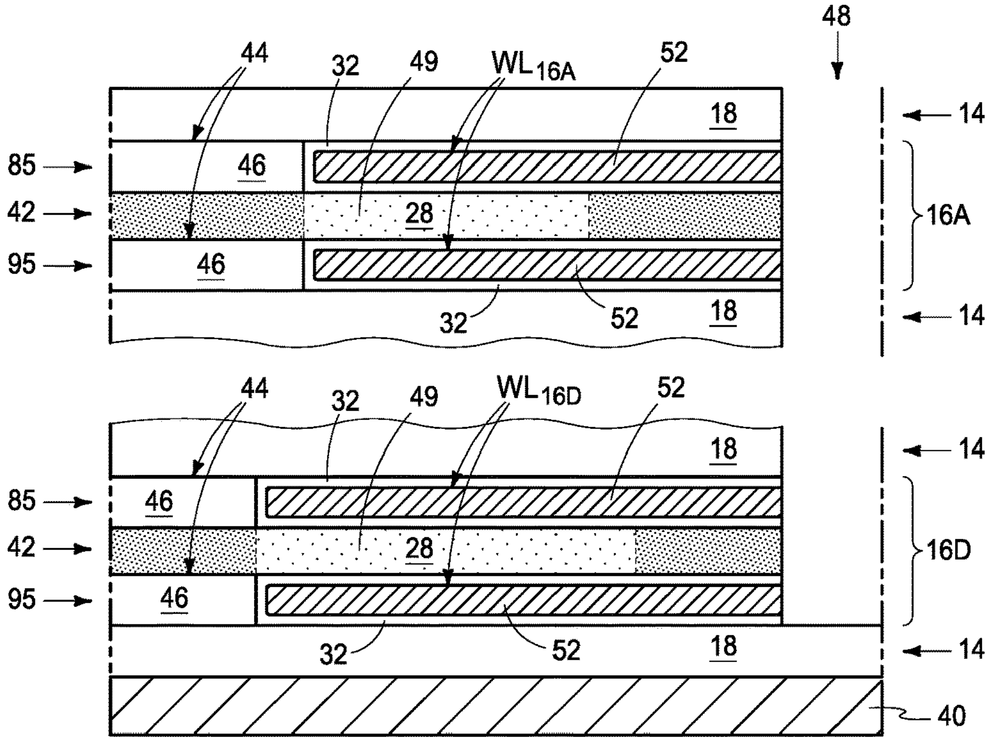
Figure 15:
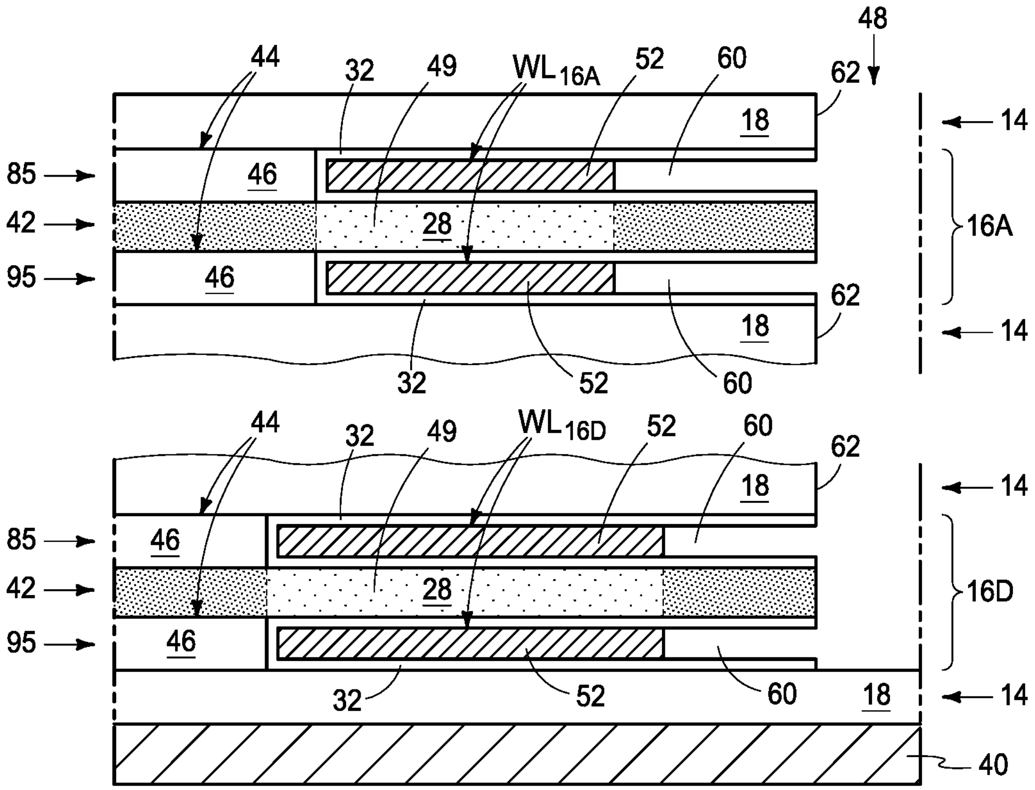

Referring to FIGS. 14 and 15, and after the second etching, through opening 48 conductive material 52 has been formed in wordline tiers 44 to form a wordline WL* in individual wordline tiers 44 that comprises a gate 30 of multiple individual transistors T (such transistors in the process of being formed). FIG. 15 shows processing analogous to that described above with respect to FIG. 9. Regardless, wordline WL* in the lower wordline tier 44 has a greater minimum width WM* than a minimum width WM* of wordline W* in the higher wordline tier 44.

Any other attribute(s) or aspect(s) as shown and/or described herein with respect to other embodiments may be used.

In one embodiment, a method used in forming memory circuitry (e.g., 8, 8*a*), with the memory circuitry comprising memory cells (e.g., MC) that individually comprise a transistor (e.g., T), comprises forming vertically-alternating insulative-material tiers (e.g., 14) and memory-cell tiers (e.g., 16*). The memory-cell tiers comprise a channel-material tier (e.g., 42) and a wordline tier (e.g., 44). The wordline tier comprises sacrificial material (e.g., 46). An opening (e.g., 48) is formed elevationally through the vertically-alternating insulative-material tiers and the memory-cell tiers. Some of the sacrificial material is etched from the wordline tiers through the opening selectively relative to the channel material (e.g., 49) of the channel-material tiers and selectively relative to the insulative material (e.g., 18) of the insulative-material tiers. The etching removes less of the sacrificial material from a lower of the wordline tiers than from a higher of the wordline tiers that is directly above the lower wordline tier. After the etching and through the opening, conductive material (e.g., 52) is formed in the wordline tiers to form a wordline (e.g., WL*) in individual of the wordline tiers that comprises a gate (e.g., 30) of multiple of individual of the transistors in individual of the memory-cell tiers. The wordline in the lower wordline tier has a greater minimum width (e.g., WM*) than a minimum width (e.g., WM*) of the wordline in the higher wordline tier. Any other attribute(s) or aspect(s) as shown and/or described herein with respect to other embodiments may be used.

FIGS. 5-15 by way of examples show fabrication of wordlines WL* largely of the configuration of that of construction 8 in FIG. 3. Alternately, such processing may be used or inherently result in the fabrication of wordlines WL* to be largely of the configuration of FIG. 4.

Any other attribute(s) or aspect(s) as shown and/or described herein with respect to other embodiments may be used in the above example method embodiments.

In one embodiment, a method used in forming memory circuitry (e.g., 8, 8*a*), with the memory circuitry comprising memory cells (e.g., MC) that individually comprise a transistor (e.g., T), comprises forming vertically-alternating insulative-material tiers (e.g., 14) and memory-cell tiers (e.g., 16*). The memory-cell tiers comprise a channel-material tier (e.g., 42) and a wordline tier (e.g., 44). Conductive material (e.g., 52) is formed in the wordline tiers to form a wordline (e.g., WL*) in individual of the wordline tiers that comprises a gate (e.g., 30) of multiple of individual of the transistors in individual of the memory-cell tiers. The wordline in a lower wordline tier has a greater minimum width (e.g., WM*) than a minimum width (e.g., WM*) of the wordline in a higher wordline tier. Any other attribute(s) or aspect(s) as shown and/or described herein with respect to other embodiments may be used.

The artisan is capable of selecting materials for the various components disclosed herein that are not particularly pertinent to the inventions disclosed herein, with some specific examples with respect to components or methods that are material to the inventions being disclosed herein.

Heretofore, laterally-inward taper of openings in which digitlines and in which vertical capacitor interconnects are formed can lead to variation in one or more of gate length (between source/drain region), gate-to-digitline spacing, and gate-to-capacitor spacing. Such can lead to significant variation from top-to-bottom of the stack in transistor-on current (Ion) and transistor-off current (Ioff). Embodiments of the invention may reduce or eliminate such variation.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be conductive metal material and/or conductively-doped semiconductive/semiconductor/semiconducting material. "Metal material" is any one or combination of an elemental metal, any mixture or alloy of two or more elemental metals, and any one or more metallic compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming memory circuitry, with the memory circuitry comprising memory cells that individually comprise a transistor, comprises forming vertically-alternating insulative-material tiers and memory-cell tiers. The memory-cell tiers comprise a channel-material tier and a wordline tier. The wordline tier comprises sacrificial material. An opening is formed elevationally through the vertically-alternating insulative-material tiers and the memory-cell tiers. Some of the sacrificial material is etched from the wordline tiers through the opening selectively relative to the channel material of the channel-material tiers and selectively relative to the insulative material of the insulative-material tiers. The etching removes less of the sacrificial material from a lower of the wordline tiers than from a higher of the wordline tiers that is directly above the lower wordline tier. After the etching and through the opening, conductive material is formed in the wordline tiers to form a wordline in individual of the wordline tiers that comprises a gate of multiple of individual of the transistors in individual of the memory-cell tiers. The wordline in the lower wordline tier has a greater minimum width than a minimum width of the wordline in the higher wordline tier.

In some embodiments, a method used in forming memory circuitry, with the memory circuitry comprising memory cells that individually comprise a transistor, comprises forming vertically-alternating insulative-material tiers and memory-cell tiers. The memory-cell tiers comprise a channel-material tier and a wordline tier. The wordline tier comprises sacrificial material. An opening is formed elevationally through the vertically-alternating insulative-material tiers and the memory-cell tiers. An etch inhibitor is flowed into the opening and laterally against sidewalls of the sacrificial material of the wordline tiers. A greater quantity of the etch inhibitor is deposited against the sidewalls of the sacrificial material in a higher of the wordline tiers than is deposited against the sidewalls of the sacrificial material in a lower of the wordline tiers that is directly below the higher wordline tier. Some of the sacrificial material is etched from the wordline tiers through the opening selectively relative to the channel material of the channel-material tiers and selectively relative to the insulative material of the insulative-material tiers, using the greater quantity of the etch inhibitor deposited against the sacrificial-material sidewalls in the higher wordline tier to etch less of the sacrificial material from the higher wordline tier than from the lower wordline tier during the etching. After the etching and through the opening, conductive material is formed in the wordline tiers to form a wordline in individual of the wordline tiers that comprises a gate of multiple of individual of the transistors in individual of the memory-cell tiers. The wordline in the lower wordline tier has a greater minimum width than a minimum width of the wordline in the higher wordline tier.

In some embodiments, a method used in forming memory circuitry, with the memory circuitry comprising memory cells that individually comprise a transistor, comprises forming vertically-alternating insulative-material tiers and memory-cell tiers. The memory-cell tiers comprise a channel-material tier and a wordline tier. The wordline tier comprises first sacrificial material. An opening is formed elevationally through the vertically-alternating insulative-material tiers and the memory-cell tiers. First etching some of the first sacrificial material in the wordline tiers through the opening selectively relative to the insulative material of the insulative-material tiers. The first etching forms a lateral recess in the wordline tiers relative to sidewalls in the opening of the insulative material of the insulative-material tiers and relative to sidewalls in the opening of the channel material of the channel-material tiers. Second sacrificial material is formed in and to less-than-fill the lateral recesses. The second sacrificial material is of different composition from that of the channel material of the channel-material tiers and from that of the insulative material of the insulative-material tiers. The second sacrificial material is laterally thicker in a higher of the wordline tiers than in a lower of the wordline tiers that is directly below the higher wordline tier. Second etching another some of the sacrificial material from the wordline tiers through the opening selectively relative to the insulative material of the insulative-material tiers. The second etching also etches through the second sacrificial material in individual of the wordline tiers before etching the another some sacrificial material in the individual wordline tiers. The laterally thicker second sacrificial material is used to etch less of the sacrificial material from the higher wordline tier than from the lower wordline tier during the second etching. After the second etching and through the opening, conductive material is formed in the wordline tiers to form a wordline in individual of the wordline tiers that comprises a gate of multiple of individual of the transistors. The wordline in the lower wordline tier has a greater minimum width than a minimum width of the wordline in the higher wordline tier.

In some embodiments, a method used in forming memory circuitry, where the memory circuitry comprises memory cells that individually comprise a transistor, comprises forming vertically-alternating insulative-material tiers and memory-cell tiers. The memory-cell tiers comprise a channel-material tier and a wordline tier. Conductive material is formed in the wordline tiers to form a wordline in individual of the wordline tiers that comprises a gate of multiple of individual of the transistors in individual of the memory-cell tiers. The wordline in a lower of the wordline tiers has a greater minimum width than a minimum width of the wordline in a higher of the wordline tiers.

In some embodiments, memory circuitry comprises vertically-alternating tiers of insulative material and memory cells. The memory cells individually comprising a transistor comprise a first source/drain region, a second source/drain region, and a channel region between the first and second source/drain regions. A gate is operatively-proximate the channel region. A capacitor comprises a first capacitor electrode, a second capacitor electrode, and a capacitor insulator between the first and second capacitor electrodes. The first capacitor electrode is directly electrically coupled to the first source/drain region. The second capacitor electrode of multiple of the capacitors is directly electrically coupled with one another. Digitlines extend elevationally through the vertically-alternating tiers. Individual of the second source/drain regions of individual of the transistors that are in different memory-cell tiers are directly electrically coupled to individual of the digitlines. A wordline is in individual of the memory-cell tiers that comprises the gate of multiple of the individual transistors in the individual memory-cell tiers. The wordline in a lower of the memory-cell tiers has a greater minimum width than a minimum width of the wordline in a higher of the memory-cell tiers that is directly above the lower memory-cell tier.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. Memory circuitry comprising:

vertically-alternating tiers of insulative material and memory cells, the memory cells individually comprising:

a transistor comprising a first source/drain region, a second source/drain region, and a channel region between the first and second source/drain regions; a gate operatively-proximate the channel region; and a capacitor comprising a first capacitor electrode, a second capacitor electrode, and a capacitor insulator between the first and second capacitor electrodes; the first capacitor electrode being directly electrically coupled to the first source/drain region, the second capacitor electrode of multiple of the capacitors being directly electrically coupled with one another;

digitlines extending elevationally through the vertically-alternating tiers, individual of the second source/drain regions of individual of the transistors that are in different memory-cell tiers being directly electrically coupled to individual of the digitlines; and a wordline in individual of the memory-cell tiers that comprises the gate of multiple of the individual transistors in the individual memory-cell tiers, the wordline in a lower of the memory-cell tiers having a greater minimum width than a minimum width of the wordline in a higher of the memory-cell tiers that is directly above the lower memory-cell tier.

2. The memory circuitry of claim 1 wherein the wordline in the individual memory-cell tiers comprises an upper wordline directly above the channel region and a low wordline directly below the channel region.

3. The memory circuitry of claim 2 wherein the low wordline in at least some of the individual memory-cell tiers has greater minimum width than minimum width of its upper wordline.

4. The memory circuitry of claim 3 wherein the greater minimum width of the low wordline and the minimum width of the upper wordline are in a same vertical cross-section, the low wordline in said at least some of the individual memory-cell tiers extends laterally-outward beyond both sides of its upper wordline in the same vertical cross-section.

5. The memory circuitry of claim 2 wherein the low wordline in at least some of the individual memory-cell tiers has minimum width that is the same as minimum width of its upper wordline.

6. The memory circuitry of claim 5 wherein the low wordline in each of the individual memory-cell tiers has minimum width that is the same as minimum width of its upper wordline.

7. The memory circuitry of claim 1 wherein the minimum width of each of the wordlines in the individual memory-cell tiers is greater than the minimum width of the wordline in the individual memory-cell tier that is immediately-directly-there-above.

8. The memory circuitry of claim 7 wherein the wordline in the individual memory-cell tiers comprises an upper wordline directly above the channel region and a low wordline directly below the channel region.

9. The memory circuitry of claim 8 wherein the low wordline in each of the individual memory-cell tiers has greater minimum width than minimum width of its upper wordline.

10. The memory circuitry of claim 9 wherein the greater minimum width of the low wordline and the minimum width of the upper wordline are in a same vertical cross-section, the low wordline extending laterally-outward beyond both sides of its upper wordline in the same vertical cross-section.

11. The memory circuitry of claim 8 wherein the low wordline in each of the individual memory-cell tiers has minimum width that is the same as minimum width of its upper wordline.

12. A method used in forming memory circuitry, the memory circuitry comprising memory cells that individually comprise a transistor, the method comprising:

forming vertically-alternating insulative-material tiers and memory-cell tiers, the memory-cell tiers comprising a channel-material tier and a wordline tier; and forming conductive material in the wordline tiers to form a wordline in individual of the wordline tiers that comprises a gate of multiple of individual of the transistors in individual of the memory-cell tiers, the wordline in a lower of the wordline tiers having a greater minimum width than a minimum width of the wordline in a higher of the wordline tiers.

13. The method of claim 12 wherein the wordline tiers are formed to individually have a void-space therein, the void-space in the lower wordline tier being wider than the void-space in the higher wordline tier, the conductive material being formed in the void-space in the lower wordline tier and in the void-space in the higher wordline tier.

14. The method of claim 13 wherein the wordline tiers comprise sacrificial material and removing the sacrificial material to form the void-spaces, the removing of the sacrificial material comprising:

flowing an etch inhibitor laterally against sidewalls of the sacrificial material of the wordline tiers, a greater quantity of the etch inhibitor being deposited against the sidewalls of the sacrificial material in the higher wordline tier than is deposited against the sidewalls of the sacrificial material in the lower wordline tier;

etching some of the sacrificial material from the wordline tiers selectively relative to the channel material of the channel-material tiers and selectively relative to the insulative material of the insulative-material tiers, using the greater quantity of the etch inhibitor deposited against the sacrificial-material sidewalls in the higher wordline tier to etch less of the sacrificial material from the higher wordline tier than from the lower wordline tier during the etching.

15. The method of claim 12 wherein, the wordline tiers comprise first sacrificial material;

forming an opening elevationally through the vertically-alternating insulative-material tiers and the memory-cell tiers;

first etching some of the first sacrificial material in the wordline tiers through the opening selectively relative to the insulative material of the insulative-material tiers, the first etching forming a lateral recess in the wordline tiers relative to sidewalls in the opening of the insulative material of the insulative-material tiers and relative to sidewalls in the opening of the channel material of the channel-material tiers;

forming second sacrificial material in and to less-than-fill the lateral recesses, the second sacrificial material being of different composition from that of the channel material of the channel-material tiers and from that of the insulative material of the insulative-material tiers, the second sacrificial material being laterally thicker in the higher wordline tier than in the lower wordline tier;

second etching another some of the sacrificial material from the wordline tiers through the opening selectively relative to the insulative material of the insulative-material tiers, the second etching also etching through the second sacrificial material in the individual wordline tiers before etching the another some sacrificial material in the individual wordline tiers, using the laterally thicker second sacrificial material to etch less of the sacrificial material from the higher wordline tier than from the lower wordline tier during the second etching; and after the second etching and through the opening, forming the conductive material in the wordline tiers.

16. A method used in forming memory circuitry, the memory circuitry comprising memory cells that individually comprise a transistor, the method comprising:

forming vertically-alternating insulative-material tiers and memory-cell tiers, the memory-cell tiers comprising a channel-material tier and a wordline tier, the wordline tier comprising sacrificial material;

forming an opening elevationally through the vertically-alternating insulative-material tiers and the memory-cell tiers;

flowing an etch inhibitor into the opening and laterally against sidewalls of the sacrificial material of the wordline tiers, a greater quantity of the etch inhibitor being deposited against the sidewalls of the sacrificial material in a higher of the wordline tiers than is deposited against the sidewalls of the sacrificial material in a lower of the wordline tiers that is directly below the higher wordline tier;

etching some of the sacrificial material from the wordline tiers through the opening selectively relative to the channel material of the channel-material tiers and selectively relative to the insulative material of the insulative-material tiers, using the greater quantity of the etch inhibitor deposited against the sacrificial-material sidewalls in the higher wordline tier to etch less of the sacrificial material from the higher wordline tier than from the lower wordline tier during the etching; and after the etching and through the opening, forming conductive material in the wordline tiers to form a wordline in individual of the wordline tiers that comprises a gate of multiple of individual of the transistors in individual of the memory-cell tiers, the wordline in the lower wordline tier having a greater minimum width than a minimum width of the wordline in the higher wordline tier.

17. The method of claim 16 wherein the sacrificial material at least predominantly comprises a silicon nitride and the etch inhibitor comprises at least one of carbon and $H_2$.

18. The method of claim 16 wherein forming the wordline in the individual wordline tiers comprises etching some of the conductive material selectively relative to the insulative material of the insulative-material tiers to form a lateral recess in the wordline tiers relative to sidewalls in the opening of the insulative material in the insulative-material tiers.

19. The method of claim 16 wherein, the wordline tier in the individual memory-cell tiers comprises an upper wordline tier directly above the channel material and a low wordline tier directly below the channel material;

the some of the sacrificial material that is etched being from each of the upper and low wordline tiers; and the conductive material being formed in each of the upper and low wordline tiers and forming the wordline in the individual memory-cell tiers to comprise an upper wordline directly above the channel material and a low wordline directly below the channel material.

20. The method of claim 19 wherein the low wordline in at least some of the individual memory-cell tiers has greater minimum width than minimum width of its upper wordline.

* * * * *